United States Patent
Arora et al.

(10) Patent No.: US 11,011,238 B2
(45) Date of Patent: May 18, 2021

(54) FLOATING DATA LINE CIRCUITS AND METHODS

(71) Applicant: TAIWAN SEMICONDUCTOR MANUFACTURING COMPANY, LTD., Hsinchu (TW)

(72) Inventors: Manish Arora, Hsinchu (TW); Hung-Jen Liao, Hsinchu (TW); Yen-Huei Chen, Jhudong Township (TW); Nikhil Puri, Hsinchu (TW); Yu-Hao Hsu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/204,268

(22) Filed: Nov. 29, 2018

(65) Prior Publication Data

US 2020/0005877 A1    Jan. 2, 2020

Related U.S. Application Data

(60) Provisional application No. 62/691,599, filed on Jun. 28, 2018.

(51) Int. Cl.
*G11C 16/06*    (2006.01)
*G11C 16/24*    (2006.01)
(Continued)

(52) U.S. Cl.
CPC ............. *G11C 16/24* (2013.01); *G11C 7/12* (2013.01); *G11C 11/005* (2013.01);
(Continued)

(58) Field of Classification Search
CPC ....... G11C 16/24; G11C 16/0483; G11C 7/12; G11C 11/005; H01L 27/11524; H01L 27/11551
(Continued)

(56) References Cited

U.S. PATENT DOCUMENTS 4,661,931 A * 4/1987 Flannagan ............... G11C 7/22
                                                      365/203
5,959,916 A * 9/1999 Kumar ................. G11C 7/1078
                                                      365/203
(Continued)

FOREIGN PATENT DOCUMENTS

EP          0698885         1/2000
KR        20010003828       1/2001
(Continued)

OTHER PUBLICATIONS

Seungjin Lee, et al., Energy-Efficient Write Circuit in STT-MRAM Based Look-Up Table(LUT) Using Comparison Write Scheme; School of Electrical and Electronic Engineering, Yonsei University, Seoul, Korea; ISOCC 2017. May 31, 2018, pp. 288-289.

(Continued)

*Primary Examiner* — Huan Hoang
(74) *Attorney, Agent, or Firm* — Hauptman Ham, LLP

(57) ABSTRACT

A write line circuit includes a power supply node configured to carry a power supply voltage level, a reference node configured to carry a reference voltage level, a first input node configured to receive a first data signal, a second input node configured to receive a second data signal, a third input node configured to receive a control signal, and an output node. The write line circuit is configured to, responsive to the first data signal, the second data signal, and the control signal, either output one of the power supply voltage level or the reference voltage level on the output node, or float the output node.

20 Claims, 6 Drawing Sheets

(51) Int. Cl.
*H01L 27/11551* (2017.01)
*G11C 7/12* (2006.01)
*G11C 16/04* (2006.01)
*G11C 11/00* (2006.01)
*H01L 27/11524* (2017.01)

(52) U.S. Cl.
CPC .... *G11C 16/0483* (2013.01); *H01L 27/11524* (2013.01); *H01L 27/11551* (2013.01)

(58) Field of Classification Search
USPC .................................................. 365/185.23
See application file for complete search history.

(56) References Cited

U.S. PATENT DOCUMENTS

| | | | | |
|---|---|---|---|---|
| 6,104,648 | A * | 8/2000 | Ooishi | G11C 7/1006 |
| | | | | 365/200 |
| 6,337,822 | B1 | 1/2002 | Kwak et al. | |
| 6,504,775 | B1 * | 1/2003 | Ma | G11C 7/12 |
| | | | | 365/154 |
| 8,619,482 | B1 * | 12/2013 | Bui | G11C 7/12 |
| | | | | 365/203 |
| 9,734,886 | B1 | 8/2017 | Derner et al. | |
| 2007/0002615 | A1 * | 1/2007 | Lee | G11C 11/5628 |
| | | | | 365/185.03 |
| 2009/0086537 | A1 * | 4/2009 | Kitagawa | G11C 11/39 |
| | | | | 365/180 |
| 2019/0147924 | A1 * | 5/2019 | Bringivijayaraghavan | |
| | | | | G11C 11/406 |
| | | | | 365/203 |

FOREIGN PATENT DOCUMENTS

| | | |
|---|---|---|
| WO | 2005038812 | 4/2005 |
| WO | 2005078732 | 8/2005 |
| WO | 2007099623 | 9/2007 |

OTHER PUBLICATIONS

Office Action dated Apr. 6, 2020 from corresponding application No. TW 108122314.

* cited by examiner

600

610
Couple a data line with a power supply node using a pre-charging circuit

620
Decouple the data line from the power supply node using the pre-charging circuit

630
Receive a first data signal at a first input node of a driving circuit coupled with the data line, the power supply node, and a reference node, and a second data signal at a second input node of the driving circuit 640
In response to the first data signal and the second data signal, use the driving circuit to decouple the data line from the power supply node and the reference node

650
Repeat operation 610

660
Use the driving circuit to output one of a power supply voltage level or a reference voltage level on the data line

FIG. 6

FLOATING DATA LINE CIRCUITS AND METHODS

BACKGROUND

Memory arrays often include memory cells arranged in columns corresponding to bit locations and rows corresponding to word locations. In such arrangements, during read and write operations, the memory cells associated with a given word are activated through one or more word lines at a row location corresponding to the given word, and data are transferred to and from the memory cells through one or more data lines at column locations corresponding to bits of the given word.

Input-output (IO) circuits used to transfer data in read and write operations are sometimes shared among multiple columns within segments of the array, each column being selectable through a switching circuit. In some cases, one or more bits of a word are masked by IO circuits so that data are written to a subset of the memory cells associated with the word during a write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of floating a data line, in accordance with some embodiments.

DETAILED DESCRIPTION

Figure 1:
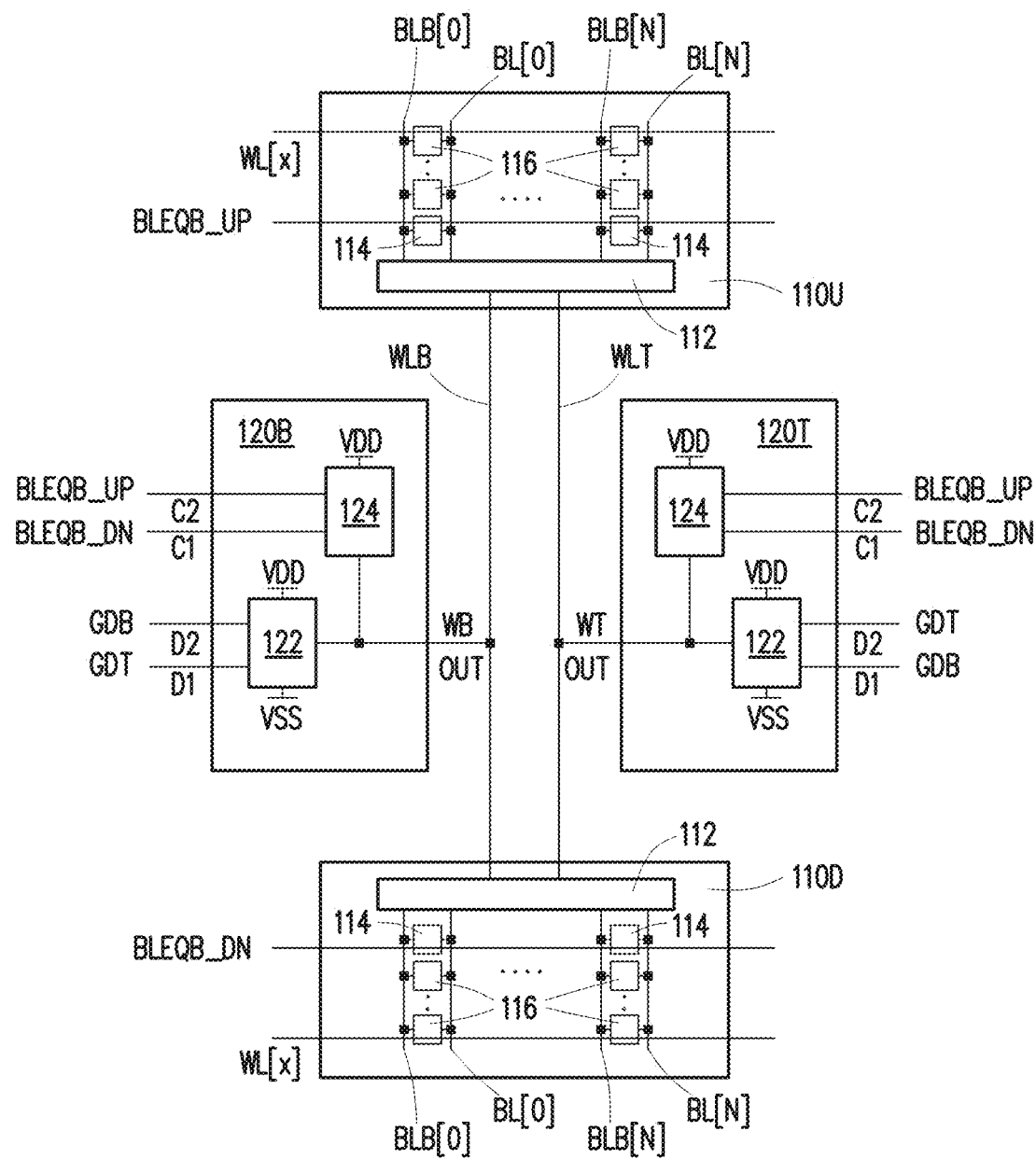
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a write line circuit of a memory circuit includes power supply and reference nodes that carry power supply and reference voltage levels, first, second, and third input nodes that receive first and second data signals and a control signal, and an output node. Responsive to the first and second data signals and the control signal, the write line circuit either outputs one of the power supply or reference voltage levels on the output node, or floats the output node.

The write line circuit is thereby capable of driving a data line to logically high and low states during write operations, floating the data line during masked write operations and, in some embodiments, pre-charging the data line to the logically high state between write operations. Compared to approaches that do not enable floating a data line during a masked write operation, the write line circuit reduces current flow in a selected memory cell and associated bit and data lines, thereby improving circuit reliability and energy efficiency. By pre-charging the data line between write operations, the write line circuit prevents the data line from discharging toward the reference voltage level, thereby avoiding possible increases in current flow and write times.

FIG. 1 is a diagram of a memory circuit 100, in accordance with some embodiments. Memory circuit 100 includes segments 110U and 110D, each electrically coupled with a write line WLB and a write line WLT. A write line circuit 120B is electrically coupled with write line WLB, and a write line circuit 120T is electrically coupled with write line WLT.

Two or more circuit elements are considered to be electrically coupled based on a direct electrical connection or an electrical connection that includes one or more additional circuit elements and is thereby capable of being controlled, e.g., made resistive or open by a transistor or other switching device.

Memory circuit 100 is a subset of a memory macro (not shown) that includes one or more additional components, e.g., at least one segment (not shown) in addition to segments 110U and 110D and/or at least one write line circuit (not shown) in addition to write line circuits 120B and 120T. In various embodiments, memory circuit does not include one or more of segment 110U, segment 110D, write line circuit 120B, write line circuit 120T, write line WLB, or write line WLT.

Each of segments 110U and 110D is a segment of a memory array of the memory macro and includes a selection circuit 112 electrically coupled with a plurality of N complementary bit line pairs BL[0 . . . N]/BLB[0 . . . N]. Each bit line pair BL[n]/BLB[n] is electrically coupled with a bit line pre-charger 114 and with a plurality of memory cells 116. In various embodiments, at least one of segments 100U or 110D includes a plurality of individual bit lines, e.g., either BL[0 . . . N] or BLB[0 . . . N], instead of plurality of bit line pairs BL[0 . . . N]/BLB[0 . . . N].

Write lines WLB and WLT and bit line pairs BL[0 . . . N]/BLB[0 . . . N] of segments 110U and 110D are data lines including conductive elements capable of transferring voltage levels to and/or from plurality of memory cells 116.

In some embodiments, each of segments 110U and 110D includes four bit line pairs. In various embodiments, one or both of segments 110U or 110D includes fewer or greater than four bit line pairs.

In the embodiment depicted in FIG. 1, segment 110U is oriented in an upward direction relative to write line circuits 120B and 120T, and segment 110D is oriented in a downward direction relative to write line circuits 120B and 120T. In various embodiments, segments 110U and 110D have orientations other than those depicted in FIG. 1.

Selection circuit 112 is configured to selectively couple write line WLT with a bit line BL[n] and write line WLB with a bit line BLB[n] responsive to a selection signal (not shown) having a state corresponding to selection of bit line pair BL[n]/BLB[n]. In some embodiments, selection circuit 112 includes a multiplexer.

Bit line pre-charger 114 includes a circuit configured to charge a given bit line pair to a power supply voltage level responsive to a pre-charge enable signal. Segment 110U is configured so that bit line pre-charger 114 receives a pre-charge enable signal BLEQB_UP on an enable line (not labeled), and segment 110D is configured so that bit line pre-charger 114 receives a pre-charge enable signal BLEQB_DN on an enable line (not labeled).

Each plurality of memory cells 116 is arranged as a column of the memory array. In various embodiments, a column of memory cells 116 includes a number of memory cells 116 ranging from 128 to 1024, fewer than 128, or greater than 1024.

A given plurality of memory cells 116 includes electrical, electromechanical, electromagnetic, or other devices (not individually labeled) configured to store bit data represented by logical states. The logical states of a memory cell 116 are capable of being programmed in a write operation and detected in a read operation.

In some embodiments, a logical state corresponds to a voltage level of an electrical charge stored in a given memory cell. In some embodiments, a logically high state corresponds to a power supply voltage level of memory circuit 100 and a logically low state corresponds to a reference voltage level of memory circuit 100. In some embodiments, a logical state corresponds to a physical property, e.g., a resistance or magnetic orientation, of a component of a given memory cell.

In some embodiments, plurality of memory cells 116 includes static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, plurality of memory cells 116 includes dynamic random-access memory (DRAM) cells or other memory cell types capable of storing bit data.

A plurality of word lines, represented in FIG. 1 by an example word line WL[x], intersects bit line pairs BL[0 . . . N]/BLB[0 . . . N]. Memory circuit 100 is thereby configured so that a given word line, e.g., word line WL[x], is communicatively coupled with one memory cell 116 in each column of memory cells 116 of a given one of segments 110U or 110D.

Two or more circuit elements are considered to be communicatively coupled based on a direct signal connection or on an indirect signal connection that includes one or more logic devices, e.g., an inverter or logic gate, between the two or more circuit elements. In some embodiments, signal communications between the two or more communicatively coupled circuit elements are capable of being modified, e.g., inverted or made conditional, by the one or more logic devices.

In operation, a memory cell 116 at a location corresponding to bit line pair BL[n]/BLB[n] and word line WL[x] is electrically coupled with one or both of write line WLT or WLB through bit line pair BL[n]/BLB[n] responsive to a word line signal (not labeled) on word line WL[x], and through the corresponding selection circuit 112 responsive to the selection signal having the state corresponding to selection of bit line pair BL[n]/BLB[n].

Each of write line circuits 120B and 120T includes a driving circuit 122 and a pre-charge circuit 124. Driving circuit 122 is electrically coupled between a power supply node VDD, configured to carry the power supply voltage level of memory circuit 100, a reference node VSS, configured to carry the reference voltage level of memory circuit 100, and an output node OUT. Pre-charge circuit 124 is electrically coupled between power supply node VDD and output node OUT.

In various embodiments, memory circuit 100 is part of a larger system, e.g., a system on a chip, and the power supply voltage level of memory circuit 100 corresponds to an operational voltage level of the system or to a memory-specific operational voltage level. In various embodiments, memory circuit 100 is part of a larger system, and the reference voltage level of memory circuit 100 corresponds to a reference voltage level of the system or to a memory-specific reference voltage level. In some embodiments, reference node VSS is a ground voltage node having a ground voltage level.

Driving circuit 122 is communicatively coupled with input nodes D1 and D2 and electrically coupled with output node OUT, and pre-charge circuit 124 is communicatively coupled with input nodes C1 and C2.

In the embodiment depicted in FIG. 1, write line circuit 120B is configured to receive a data signal GDT at input node D1, a data signal GDB at input node D2, pre-charge enable signal BLEQB_DN at input node C1, and pre-charge enable signal BLEQB_UP at input node C2, and to output a write line signal WB at output node OUT electrically coupled with write line WLB.

In the embodiment depicted in FIG. 1, write line circuit 120T is configured to receive data signal GDB at input node D1, data signal GDT at input node D2, pre-charge enable signal BLEQB_DN at input node C1, and pre-charge enable signal BLEQB_UP at input node C2, and to output a write line signal WT at output node OUT electrically coupled with write line WLT.

A given driving circuit 122 is configured to, responsive to logical states of data signals received at input nodes D1 and D2, either output one of the power supply voltage level or the reference voltage level at output node OUT or float output node OUT by having a high output impedance at output node OUT.

Driving circuit 122 is configured to output the write line signal having one of the power supply voltage level or the reference voltage level at output node OUT responsive to the logical state of the data signal received at input node D1. In various embodiments, driving circuit 122 is configured to output the write line signal having the power supply voltage level responsive to one of a low or a high logical state at input node D1, and to output the write line signal having the reference voltage level responsive to the other of the low or the high logical state at input node D1.

In some embodiments, driving circuit 122 includes an inverter, e.g., transistors N1 and P1 discussed below with respect to FIGS. 2 and 3, and is thereby configured to output the write line signal having the power supply voltage level responsive to the low logical state at input node D1, and to output the write line signal having the reference voltage level responsive to the high logical state at input node D1.

In the embodiment depicted in FIG. 1, write line circuit 120B includes driving circuit 122 configured to receive data signal GDT at input node D1, and is thereby configured to output write line signal WB having one of the power supply voltage level or the reference voltage level to write line WLB responsive to the logical state of data signal GDT.

In the embodiment depicted in FIG. 1, write line circuit 120T includes driving circuit 122 configured to receive data signal GDB at input node D1, and is thereby configured to output write line signal WT having one of the power supply voltage level or the reference voltage level to write line WLT responsive to the logical state of data signal GDB.

Driving circuit 122 is configured to either float output node OUT or output the write line signal having one of the power supply voltage level or the reference voltage level responsive to the logical states of the data signals received on input nodes D1 and D2. In various embodiments, driving circuit 122 is configured to float output node OUT responsive to one or more combinations of a low or high logical state at input node D1 and a low or high logical state at input node D2, and to output the write line signal having one of the power supply voltage level or the reference voltage level responsive to one or more other combinations of the low or high logical state at input node D1 and the low or high logical state at input node D2.

In the embodiment depicted in FIG. 1, driving circuit 122 is configured to, in operation, float output node OUT in response to the low logical state at each of input nodes D1 and D2, output the write line signal having the power supply voltage level in response to the low logical state at input node D1 and the high logical state at input node D2, and output the write line signal having the reference voltage level in response to the high logical state at input node D1 and either the low or the high logical state at input node D2.

In various embodiments, driving circuit 122 is configured to have the high output impedance at output node OUT by including one or more switching devices (not depicted in FIG. 1) electrically coupled with output node OUT. A switching device includes one or more electrical or electromechanical constructions capable of making and breaking electrical connections between two or more terminals responsive to voltage levels representing logical states received at one or more control terminals. In various embodiments, a switching device includes one or more of a transistor, transmission gate, or other device suitable for controlling electrical connections.

In various embodiments, a transistor includes one or a combination of a field-effect transistor (FET), a metal-oxide-semiconductor field-effect transistor (MOSFET), a fin field-effect transistor (FinFET), an n-type transistor, a p-type transistor, a vertical gate transistor, a bipolar or other transistor type.

In some embodiments, driving circuit 122 includes one or more switching devices, e.g., a transistor P2 discussed below with respect to FIG. 2, configured to selectively decouple driving circuit 122 from power supply node VDD responsive to the data signal received at input node D2, and is thereby at least partially capable of having the high output impedance at output node OUT.

In some embodiments, driving circuit 122 includes one or more switching devices, e.g., transistor N1 discussed below with respect to FIGS. 2 and 3, configured to selectively decouple driving circuit 122 from reference node VSS responsive to the data signal received at input node D1, and is thereby at least partially capable of having the high output impedance at output node OUT.

In some embodiments, driving circuit 122 includes one or more switching devices, e.g., a transistor P3 discussed below with respect to FIG. 3, configured to selectively decouple driving circuit 122 from output node OUT responsive to the data signals received at input nodes D1 and D2, and is thereby at least partially capable of having the high output impedance at output node OUT.

In various embodiments, driving circuit 122 includes one or more logic gates, e.g., a NOR gate NOR1 discussed below with respect to FIG. 3, configured to receive the data signals at one or both of input nodes D1 or D2 and generate one or more switching signals capable of controlling one or more switching devices, driving circuit 122 thereby being configured to be at least partially capable of having the high output impedance at output node OUT. In various embodiments, driving circuit 122 includes one or more of an inverter, OR gate, NOR gate, XOR gate, AND gate, NAND gate, or other logic gate suitable for applying a logic scheme.

In the embodiment depicted in FIG. 1, write line circuit 120B includes driving circuit 122 configured to receive data signals GDT and GDB at respective input nodes D1 and D2, and is thereby configured to either float write line WLB or output write line signal WB having one of the power supply voltage level or the reference voltage level to write line WLB responsive to the logical states of data signals GDT and GDB.

In the embodiment depicted in FIG. 1, write line circuit 120T includes driving circuit 122 configured to receive data signals GDB and GDT at respective input nodes D1 and D2, and is thereby configured to either float write line WLT or output write line signal WT having one of the power supply voltage level or the reference voltage level to write line WLT responsive to the logical states of data signals GDB and GDT.

A given pre-charge circuit 124 is configured to, responsive to logical states of enable signals received at input nodes C1 and C2, either output the power supply voltage level at output node OUT or float output node OUT by having a high output impedance at output node OUT. In operation, a pre-charge circuit 124 floating the associated output node OUT allows the associated driving circuit 122 to control output node OUT, and a given driving circuit 122 floating the associated output node OUT allows the associated pre-charge circuit 124 to control output node OUT.

By including driving circuit 122 and pre-charge circuit 124 as depicted in FIG. 1, write line circuits 120B and 120T are configured to either output the write line signal having one of the power supply voltage level or the reference voltage level at output node OUT, or float output node OUT responsive to a combination of the data signals received at input nodes D1 and D2 and the enable signals received at input nodes C1 and C2.

In various embodiments, pre-charge circuit 124 is configured to output the power supply voltage level responsive to one or more combinations of a low or high logical state at input node C1 and a low or high logical state at input node C2, and to float output node OUT responsive to one or more other combinations of the low or high logical state at input node C1 and the low or high logical state at input node C2.

In some embodiments, one or both of write line circuits 120B and 120T does not include one of input nodes C1 or C2, and pre-charge circuit 124 is configured to either output the power supply voltage level at output node OUT or float output node OUT responsive to a low or high logical state at a single input node C1 or C2. In some embodiments, one or both of write line circuits 120B and 120T includes one or more input nodes (not shown) in addition to input nodes C1 and C2, and pre-charge circuit 124 is configured to either output the power supply voltage level at output node OUT or float output node OUT responsive to combinations of the low or high logical states at some or all of the input nodes.

In some embodiments, one or both of write line circuits 120B or 120T does not include pre-charge circuit 124, and the one or both of write line circuits 120B or 120T is configured to either output the write line signal having one of the power supply voltage level or the reference voltage level at output node OUT or float output node OUT responsive solely to the data signals received at input nodes D1 and D2.

In some embodiments, pre-charge circuit 124 includes a switching device, e.g., a transistor P4 discussed below with respect to FIG. 4, configured to selectively decouple output node OUT from power supply node VDD responsive to the enable signal received at input node C1, and is thereby at least partially capable of having the high output impedance at output node OUT.

In some embodiments, pre-charge circuit 124 includes a switching device, e.g., a transistor P5 discussed below with respect to FIG. 4, configured to selectively decouple output node OUT from power supply node VDD responsive to the enable signal received at input node C2, and is thereby at least partially capable of having the high output impedance at output node OUT.

In some embodiments, pre-charge circuit 124 includes a single switching device, e.g., one of transistors P4 or P5 discussed below with respect to FIG. 4, configured to selectively decouple output node OUT from power supply node VDD responsive to the enable signals received at both of input nodes C1 and C2, and is thereby at least partially capable of having the high output impedance at output node OUT. In some embodiments, pre-charge circuit 124 includes one or more logic circuits (not shown) configured to control a switching device responsive to the enable signals received at both of input nodes C1 and C2.

In the embodiment depicted in FIG. 1, each of write line circuits 120B and 120T includes pre-charge circuit 124 configured to receive enable signal BLEQB_DN at input node C1 and enable signal BLEQB_UP at input node C2. Write line circuit 120B is thereby configured to either output the power supply voltage level to write line WLB or float write line WLB responsive to the logical states of enable signals BLEQB_DN and BLEQB_UP, and write line circuit 120T is thereby configured to either output the power supply voltage level to write line WLT or float write line WLT responsive to the logical states of enable signals BLEQB_DN and BLEQB_UP.

Memory circuit 100 is configured so that, between write operations, enable signals BLEQB_DN and BLEQB_UP are received at respective input nodes C1 and C2 having logical states that cause pre-charge circuit 124 to output the power supply voltage level to output node OUT, and, during write operations, enable signals BLEQB_DN and BLEQB_UP are received at respective input nodes C1 and C2 having logical states that cause pre-charge circuit 124 to float output node OUT.

Between write operations, pre-charge circuit 124 outputting the power supply voltage level to output node OUT enables write line circuit 120B to maintain write line WLB at the power supply voltage level, and enables write line circuit 120T to maintain write line WLT at the power supply voltage level. During write operations, pre-charge circuit 124 floating output node OUT enables write line WLB to be controlled by driving circuit 122 of write line circuit 120B, and enables write line WLT to be controlled by driving circuit 122 of write line circuit 120T.

During a write operation in which a data bit is being written to a memory cell 116 in a selected bit line pair BL[n]/BLB[n] of either of segments 110U or 110D, memory circuit 100 is configured so that data signals GDT and GDB are received as a complementary pair. During the write operation in which data signals GDT and GDB are received as a complementary pair, based on the configuration discussed above, write line circuit 120B outputs write line signal WB having one of the power supply voltage level or the reference voltage level to write line WLB, and write line circuit 120T outputs write line signal WT having the other of the power supply voltage level or the reference voltage level to write line WLT.

During a write operation in which a data bit corresponding to a memory cell 116 in a selected bit line pair BL[n]/BLB[n] of either of segments 110U or 110D is masked, memory circuit 100 is configured so that each of data signals GDT and GDB is received having the low logical state. During the write operation in which data signals GDT and GDB are received having the low logical state, based on the configuration discussed above, write line circuit 120B floats write line WLB, and write line circuit 120T floats write line WLT.

In some embodiments, during a write operation in which a data bit corresponding to a memory cell 116 in a selected bit line pair BL[n]/BLB[n] of either of segments 110U or 110D is masked, memory circuit 100 is configured so that each of data signals GDT and GDB is received having the high logical state, and, based on the configuration discussed above, write line circuit 120B floats write line WLB, and write line circuit 120T floats write line WLT.

As discussed above, memory circuit 100 is configured so that, during a write operation, in some embodiments, a selected memory cell 116 is electrically coupled with the corresponding bit line pair BL[n]/BLB[n] in response to the word line signal on the corresponding word line WL[x], and the bit line pair BL[n]/BLB[n] is electrically coupled with respective write lines WLT and WLB through selection circuit 112.

In the case in which the data bit is not masked in the write operation, write line circuits 120B and 120T outputting respective write line signals WB and WT having the power supply and reference voltage levels as a complementary pair cause the data bit to be written to the selected memory cell 116.

In the case in which the data bit is masked in the write operation, write line circuits 120B and 120T floating respective write lines WLB and WLT cause the selected memory cell 116 to be electrically coupled with floating respective bit lines BLB[n] and BL[n].

Compared to approaches in which a selected memory cell is electrically coupled with bit lines that are not floating during a write operation in which a data bit is masked, e.g., approaches in which bit lines are held at or near a power supply voltage level during a write operation in which a data bit is masked, the configuration of memory circuit 100 reduces current flow in the selected cell and associated bit lines and write lines, thereby improving circuit reliability and energy efficiency.

The benefits discussed above are further achieved by memory circuit 100 being configured to maintain write lines WLB and WLT at the power supply voltage level between write operations, thereby preventing one or both of write lines WLB or WLT from discharging through leakage currents to a voltage level at or near the reference voltage level, in which case a memory cell could be unintentionally programmed during a masked write operation.

Figure 2:
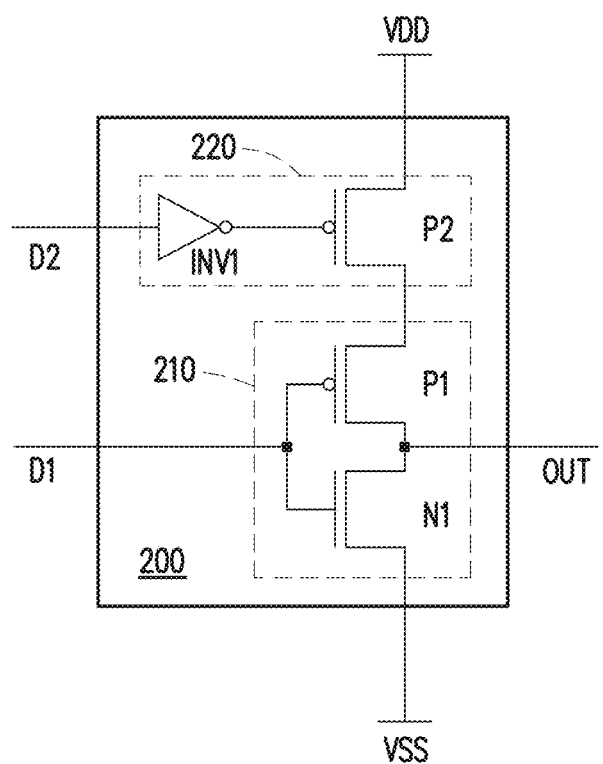
FIG. 2 is a diagram of a driving circuit, in accordance with some embodiments.

FIG. 2 is a diagram of a driving circuit 200, in accordance with some embodiments. Driving circuit 200 is usable as a driving circuit 122 discussed above with respect to FIG. 1. Driving circuit 200 includes PMOS transistors P1 and P2 and NMOS transistor N1 electrically coupled in series between power supply node VDD and reference node VSS.

Transistors N1 and P1 are configured as an inverter, also referred to as a write driver 210, in which a source of transistor N1 is electrically coupled with reference node VSS, a drain of transistor N1 is electrically coupled with a drain of transistor P1, and a gate of transistor N1 is communicatively coupled with a gate of transistor P1. A source of transistor P1 is electrically coupled with a drain of transistor P2, and a source of transistor P2 is electrically coupled with power supply node VDD.

The gates of transistors N1 and P1 are communicatively coupled with input node D1, and the drains of transistors N1 and P1 are electrically coupled with output node OUT. An inverter INV1 is coupled between input node D2 and a gate of transistor P2, with an input terminal (not labeled) communicatively coupled with input node D1, and an output terminal (not labeled) communicatively coupled with the gate of transistor P2.

In operation, the low logical state at input node D1 is received at the gates of transistors N1 and P1, thereby turning off transistor N1 and decoupling output node OUT from reference node VSS, and turning on transistor P1 and electrically coupling output node OUT with the drain of transistor P2. The high logical state at input node D1 is received at the gates of transistors N1 and P1, thereby turning on transistor N1 and electrically coupling output node OUT with reference node VSS, and turning off transistor P1 and decoupling output node OUT from the drain of transistor P2.

In operation, the low logical state at input node D2 is inverted by inverter INV1 to the high logical state at the gate of transistor P2, thereby turning off transistor P2 and decoupling the source of transistor P1 from power supply node VDD. The high logical state at input node D2 is inverted by inverter INV1 to the low logical state at the gate of transistor P2, thereby turning on transistor P2 and electrically coupling the source of transistor P1 with power supply node VDD.

Inverter INV1 and transistor P2 are also referred to as an interrupt circuit 220. In some embodiments, driving circuit 200 includes an interrupt circuit 220 that does not include inverter INV1, and in which transistor P2 is an NMOS transistor. In these embodiments, in operation, the low logical state at input node D2 turns off transistor P2, and the high logical state at input node D2 turns on transistor P2.

In operation, the low logical state at input nodes D1 and D2, by turning off transistors N1 and P2, decouples output node OUT from both reference node VSS and power supply node VDD, thereby floating output node OUT by having a high impedance at output node OUT.

In operation, the low logical state at input node D1 and the high logical state at input node D2, by turning off transistor N1 and turning on transistors P1 and P2, decouples output node OUT from reference node VSS and electrically couples output node OUT with power supply node VDD, thereby outputting the power supply voltage level on output node OUT.

In operation, the high logical state at input node D1 and the low logical state at input node D2, by turning on transistor N1, and turning off transistors P1 and P2, electrically couples output node OUT with reference node VSS and decouples output node OUT from power supply node VDD, thereby outputting the reference voltage level on output node OUT.

In operation, the high logical state at input node D1 and the high logical state at input node D2, by turning on transistors N1 and P2, and turning off transistor P1, electrically couples output node OUT with reference node VSS and decouples output node OUT from power supply node VDD, thereby outputting the reference voltage level on output node OUT.

By the configuration discussed above, driving circuit 200 is capable of enabling the benefits discussed above with respect to memory circuit 100 and FIG. 1.

Figure 3:
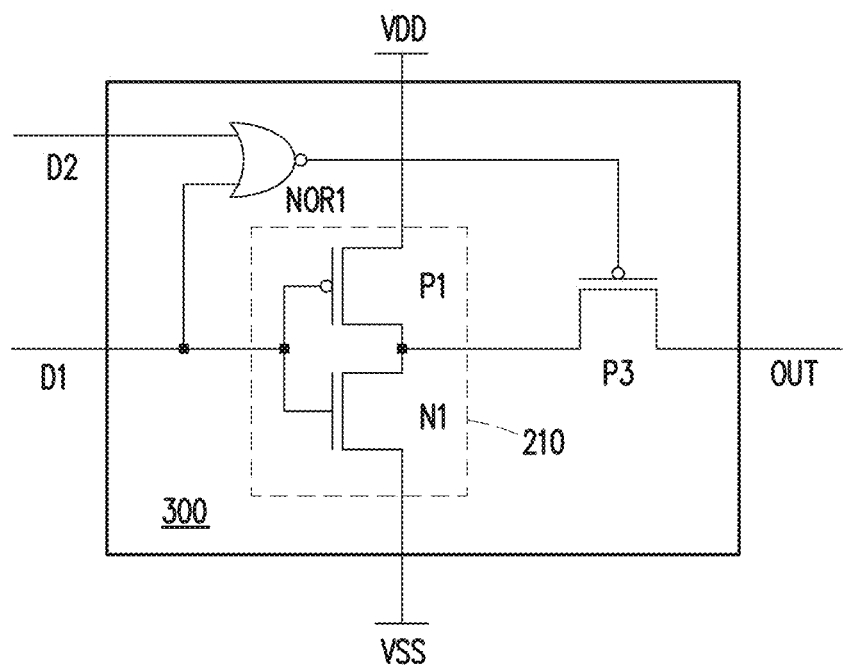
FIG. 3 is a diagram of a driving circuit, in accordance with some embodiments.

FIG. 3 is a diagram of a driving circuit 300, in accordance with some embodiments. Driving circuit 300 is usable as a driving circuit 122 discussed above with respect to FIG. 1.

Driving circuit 300 includes write driver 210, which includes transistors N1 and P1, discussed above with respect to FIG. 2, but does not include inverter INV1 or transistor P2 of interrupt circuit 220. In addition to write driver 210, driving circuit 300 includes a node INT, NOR gate NOR1, and PMOS transistor P3.

Write driver 210 includes transistors N1 and P1 electrically coupled in series between power supply node VDD and reference node VSS, with the source of transistor N1 electrically coupled with reference node VSS, and the source of transistor P1 electrically coupled with power supply node VDD.

The drains of transistors N1 and P1 are electrically coupled with node INT, and transistor P3 is coupled between node INT and output node OUT. One of a source or drain of transistor P3 is electrically coupled with node INT, and the other of the source or drain of transistor P3 is electrically coupled with output node OUT. A gate of transistor P3 is communicatively coupled with an output terminal (not labeled) of NOR gate NOR1.

In addition to the output terminal, NOR gate NOR1 includes two input terminals (not labeled). A first input terminal is communicatively coupled with input node D1, and a second input terminal is communicatively coupled with input node D2.

In operation, the low logical state at input node D1 is received at the gates of transistors N1 and P1, thereby turning off transistor N1 and decoupling node INT from reference node VSS, and turning on transistor P1 and electrically coupling node INT with power supply node VDD. Conversely, the high logical state at input node D1 is received at the gates of transistors N1 and P1, thereby turning on transistor N1 and electrically coupling node INT with reference node VSS, and turning off transistor P1 and decoupling node INT from power supply node VDD.

In operation, the logical state received at input node D1 is received at the first input terminal of NOR gate NOR1, and the logical state received at input node D2 is received at the second input terminal of NOR gate NOR1.

In operation, the high logical state at input node D2 received at the second input of NOR gate NOR1 causes the output terminal of NOR gate NOR1, and thereby the gate of transistor P3, to have the low logical state for each of the low and high logical states at input node D1. In response to the low logical state at the gate of transistor P3, transistor P3 is turned on, thereby electrically coupling node INT with output node OUT.

In operation, the low logical state at input node D2 received at the second input terminal of NOR gate NOR1 causes the output terminal of NOR gate NOR1, and thereby the gate of transistor P3, to have a logical state based on the logical state at input node D1.

In this case, the low logical state at input node D1 received at the first input terminal of NOR gate NOR1 causes the output terminal of NOR gate NOR1, and thereby the gate of transistor P3, to have the high logical state, thereby turning off transistor P3 and decoupling node INT from output node OUT. The high logical state at input node D1 received at the first input terminal of NOR gate NOR1 causes the output terminal of NOR gate NOR1, and thereby the gate of transistor P3, to have the low logical state, thereby turning on transistor P3 and electrically coupling node INT with output node OUT.

In operation, the low logical state at input nodes D1 and D2, by turning off transistors N1 and P3, decouples output node OUT from node INT and therefore both reference node VSS and power supply node VDD, thereby floating output node OUT by having a high impedance at output node OUT.

In operation, the low logical state at input node D1 and the high logical state at input node D2, by turning off transistor N1 and turning on transistors P1 and P3, decouples output node OUT from reference node VSS and electrically couples output node OUT with power supply node VDD via node INT, thereby outputting the power supply voltage level on output node OUT.

In operation, the high logical state at input node D1 and the low logical state at input node D2, by turning on transistors N1 and P3, and turning off transistor P1, electrically couples output node OUT with reference node VSS via node INT, and decouples output node OUT from power supply node VDD, thereby outputting the reference voltage level on output node OUT.

In operation, the high logical state at input node D1 and the high logical state at input node D2, by turning on transistors N1 and P3, and turning off transistor P1, electrically couples output node OUT with reference node VSS via node INT, and decouples output node OUT from power supply node VDD, thereby outputting the reference voltage level on output node OUT.

By the configuration discussed above, driving circuit 300 is capable of enabling the benefits discussed above with respect to memory circuit 100 and FIG. 1.

Figure 4:
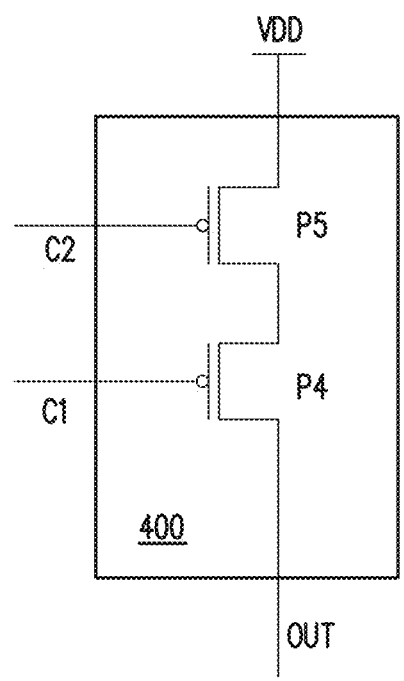
FIG. 4 is a diagram of a pre-charge circuit, in accordance with some embodiments.

FIG. 4 is a diagram of a pre-charge circuit 400, in accordance with some embodiments. Pre-charge circuit 400 is usable as a pre-charge circuit 124 discussed above with respect to FIG. 1.

Pre-charge circuit 400 includes PMOS transistors P4 and P5 electrically coupled in series between power supply node VDD and output node OUT. A drain of transistor P4 is electrically coupled with output node OUT, a source of transistor P4 is electrically coupled with a drain of transistor P5, and a source of transistor P5 is electrically coupled with power supply node VDD. A gate of transistor P4 is communicatively coupled with input node C1, and a gate of transistor P5 is communicatively coupled with input node C2.

In operation, the low logical state at input node C1 is received at the gate of transistor P4, thereby causing transistor P4 to turn on, electrically coupling output node OUT with the drain of transistor P5. The high logical state at input node C1 is received at the gate of transistor P4, thereby causing transistor P4 to turn off, electrically decoupling output node OUT from the drain of transistor P5, and thereby from power supply node VDD.

In operation, the low logical state at input node C2 is received at the gate of transistor P5, thereby causing transistor P5 to turn on, electrically coupling the source of transistor P4 with power supply node VDD. The high logical state at input node C2 is received at the gate of transistor P5, thereby causing transistor P5 to turn off, electrically decoupling the source of transistor P4, and thereby output node OUT, from power supply node VDD.

Pre-charge circuit 400 is thereby configured so that, in operation, the high logical state at either of input nodes C1 or C2 causes output node OUT to be decoupled from power supply node VDD, and the low logical state at both of input nodes C1 and C2 causes output node OUT to be electrically coupled with power supply node VDD.

By the configuration discussed above, pre-charge circuit 400 is capable of enabling the benefits discussed above with respect to memory circuit 100 and FIG. 1.

Figure 5:
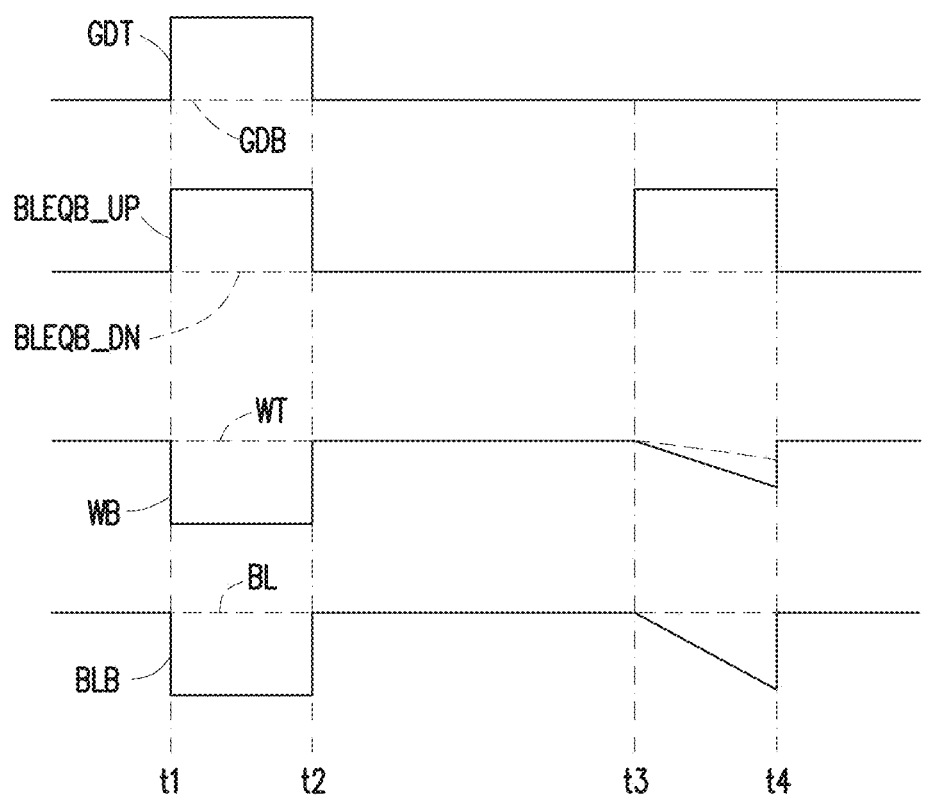
FIG. 5 is a plot of memory circuit operating parameters, in accordance with some embodiments.

FIG. 5 is a plot of memory circuit operating parameters, in accordance with some embodiments. FIG. 5 depicts non-limiting examples of data signals GDT and GDB, enable signals BLEQB_UP and BLEQB_DN, write line signals WB and WT, each discussed above with respect to FIG. 1, and two bit line voltages BL and BLB. Bit line voltages BL and BLB represent non-limiting examples of voltage levels on one pair of bit line pairs BL[n]/BLB[n] discussed above with respect to FIG. 1.

An interval from a time t1 to a time t2 represents a first write operation in which a data bit is written to a selected memory cell 116 in segment 110U corresponding to the bit line pair BL[n]/BLB[n]. An interval from a time t3 to a time t4 represents a second write operation in which the selected memory cell 116 is masked. Timing and control of the various signals during the write operations are based on one or more signals, e.g., a clock signal or a mask enable signal, that are not depicted for the purpose of clarity.

Prior to time t1, each of data signals GDT and GDB is at the low logical state. At time t1, the start of the first write operation, data signal GDT transitions from the logically low state to the logically high state, and data signal GDB remains at the low logical state, the differing logical states representing the data bit. In a complementary write operation (not depicted), a complementary data bit is represented by data signal GDB transitioning from the logically low state to the logically high state, and data signal GDT remaining at the low logical state.

At time t2, the end of the first write operation, data signal GDT transitions from the logically high state back to the logically low state, and data signal GDB remains at the logically low state.

From time t3 to time t4, each of data signals GDT and GDB remains at the logically low state, corresponding to the selected memory cell 116 being masked in the second write operation.

From time t1 to time t2, enable signal BLEQB_UP toggles from the logically low state to the logically high state, and back to the logically low state, corresponding to the memory cell 116 in segment 110U being selected in the first write operation. Enable signal BLEQB_DN remains at the logically low state because a memory cell 116 in segment 110D is not selected in the first write operation.

From time t3 to time t4, enable signal BLEQB_UP toggles from the logically low state to the logically high state, and back to the logically low state, corresponding to the memory cell 116 in segment 110U being selected in the second write operation while enable signal BLEQB_DN remains at the logically low state because a memory cell 116 in segment 110D is not selected in the second write operation.

In the non-limiting example depicted in FIG. 5, an enable signal BLEQB_UP or BLEQB_DN having the logically low state corresponds to a given bit line pre-charger 114 being activated to charge a corresponding bit line pair BL[n]/BLB[n] to the power supply voltage level. An enable signal BLEQB_UP or BLEQB_DN having the logically high state corresponds to the bit line pre-charger 114 being deactivated.

The bit line pre-charger 114 corresponding to the selected memory cell 116 is therefore deactivated during both the first and second write operations based on enable signal BLEQB_UP toggling to the logically high state, and otherwise activated to charge the bit line pair BL[n]/BLB[n] corresponding to the selected memory cell 116 to the power supply voltage level. Each of bit line voltages BL and BLB is thereby charged to the high logical state before time t1, from time t2 to time t3, and after time t4.

In the non-limiting example depicted in FIG. 5, both of enable signals BLEQB_UP and BLEQB_DN having the logically low state corresponds to a given pre-charge circuit 124 outputting the power supply voltage level to a corresponding output node. One or both of enable signals BLEQB_UP or BLEQB_DN having the logically high state corresponds to the given pre-charge circuit 124 floating the corresponding output node.

Pre-charge circuits 124 of write line circuits 120T and 120B therefore float respective write lines WLT and WLB during the first and second write operations, and output the power supply voltage level to respective write lines WLT and WLB before time t1, from time t2 to time t3, and after time t4.

During both the first and second write operations, based on the selection of the memory cell 116, bit line pair BL[n]/BLB[n] is electrically coupled with respective write lines WLT and WLB. Because the bit line pre-charger 114 corresponding to the selected memory cell 116 is deactivated, and write line circuits 120T and 120B float respective write lines WLT and WLB, write line signals WT and WB correspond to respective bit line voltages BL and BLB during the first and second write operations.

During the first write operation, from time t1 to time t2, write line signal WB and bit line voltage BLB toggle from the logically high state to the logically low state and back to the logically high state, corresponding to driving circuit 122 of write line circuit 120B outputting the reference voltage level to write line WLB in response to receiving the high logical state of data signal GDT and the low logical state of data signal GDB.

During the first write operation, from time t1 to time t2, write line signal WT and bit line voltage BL remain at the logically high state, corresponding to driving circuit 122 of write line circuit 120T outputting the power supply voltage level to write line WLT in response to receiving the low logical state of data signal GDB and the high logical state of data signal GDT.

During the second write operation, from time t3 to time t4, because the bit line pre-charger 114 corresponding to the selected memory cell 116 is deactivated, and each of write lines WLT and WLB is floating with respect to write line circuits 120T and 120B, write line signals WT and WB and bit line voltages BL and BLB are controlled by the logical states stored in the selected memory cell 116 during the first write operation.

Because write line signal WT and bit line voltage BL store the logically high state in the selected memory cell 116 during the first write operation, the selected memory cell 116 causes write line signal WT and bit line voltage BL to remain at the logically high state during the second write operation.

Because write line signal WB and bit line voltage BLB cause the logically low state to be stored in the selected memory cell 116 during the first write operation, the selected memory cell 116 causes write line signal WB and bit line voltage BLB to move toward the logically low state during the second write operation. The selected memory cell causing the write line signal WB and bit line voltage BLB to move toward the logically low state is also referred to as a dummy read operation.

The rates at which each of write line signal WB and bit line voltage BLB move toward the logically low state is based on a current driving capacity of the selected memory cell 116 and distributed parasitic resistance and capacitance values of write line WLB and the bit line BLB and selection circuit 112 corresponding to the selected memory cell 116.

In the embodiment depicted in FIG. 5, because bit line BLB[n] is between the corresponding selected memory cell 116 and write line WLB, the distributed parasitic resistance and capacitance values cause the selected memory cell 116 to move bit line voltage BLB faster than write line WLB toward the logically low state.

FIG. 6 is a flowchart of a method 600 of floating a data line, in accordance with one or more embodiments. Method 600 is usable with a memory circuit, e.g., memory circuit 100 discussed above with respect to FIG. 1.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are a subset of operations of a method of operating a memory circuit.

At operation 610, in some embodiments, a data line is coupled with a power supply node using a pre-charging circuit. The power supply node carries a power supply voltage level, and coupling the data line with the power supply node causes the data line to have the power supply voltage level.

In some embodiments, at least one of the power supply node is one power supply node of a plurality of power supply nodes, the data line is one data line of a plurality of data lines, or the pre-charging circuit is one pre-charging circuit of a plurality of pre-charging circuits, and coupling the data line with the power supply node includes at least one of coupling more than one data line of the plurality of data lines, coupling with more than one power supply node of the plurality of power supply nodes, or using more than one pre-charging circuit of the plurality of pre-charging circuits.

The pre-charging circuit couples the data line with the power supply node in response to one or more logical states of a control signal or plurality of control signals. In various embodiments, at least one of the control signal or the plurality of control signals is an enable signal, and a bit line pre-charger of the memory circuit responds to the enable signal by pre-charging a bit line pair associated with the pre-charging circuit. In some embodiments, a control signal is a signal that is separate from an enable signal and based on one or more enable signals.

In some embodiments, the one or more control signals change logical states in response to the end of a write operation on one or more memory cells associated with the pre-charging circuit. In some embodiments, the write operation includes writing data bits to each of one or more memory cells and masking the writing of data bits to each of one or more other memory cells.

In some embodiments, coupling the data line with the power supply node includes coupling write line WLB or WLT with power supply node VDD using pre-charge circuit 124, each discussed above with respect to FIG. 1.

In some embodiments, coupling the data line with the power supply node includes using a switching device. In some embodiments, coupling the data line with the power supply node includes using one or both of transistors P4 or P5 of pre-charging circuit 400, discussed above with respect to FIG. 4.

At operation 620, in some embodiments, the data line is decoupled from the power supply node using the pre-charging circuit. Decoupling the data line from the power supply node is performed by reversing operation 610 for each of the embodiments discussed above, and includes the pre-charging circuit having a high output impedance with reference to the data line.

The pre-charging circuit decouples the data line from the power supply node in response to one or more logical states of the one or more control signals being different from the one or more logical states that cause the pre-charging circuit to couple the data line with the power supply node. In some embodiments, the one or more control signals change logical states in response to the start of a write operation on the one or more memory cells associated with the pre-charging circuit. In some embodiments, the write operation includes writing data bits to each of one or more memory cells and masking the writing of data bits to each of one or more other memory cells.

Decoupling the data line from the power supply node is performed so that the data line is decoupled from the power supply node using the pre-charging circuit concurrently with operations 630, 640, and in some embodiments 660, each discussed below.

At operation 630, a first data signal is received at a first input node of a driving circuit coupled with the data line, the power supply node, and a reference node, and a second data signal is received at a second input node of the driving circuit. The first and second data signals are generated by the memory circuit and have logical states corresponding to a write operation in which writing a data bit to a memory cell associated with the driving circuit is masked.

In various embodiments, in the masked write operation, the memory circuit generates the first and second data signals each having the logically low state, each having the logically high state, the first data signal having the logically low state and the second data signal having the logically high state, or the first data signal having the logically high state and the second data signal having the logically low state.

In some embodiments, receiving the first and second data signals includes receiving the first and second data signals at respective input nodes D1 and D2 of write line circuit 120B or 120T, discussed above with respect to memory circuit 100 and FIG. 1.

In some embodiments, receiving the first and second data signals includes receiving the first data signal with write driver 210 and the second data signal with interrupt circuit 220, discussed above with respect to driving circuit 200 and FIG. 2. In some embodiments, receiving the first and second data signals includes receiving the first data signal with write driver 210 and NOR gate NOR1, and receiving the second data signal with NOR gate NOR1, discussed above with respect to driving circuit 300 and FIG. 3.

At operation 640, in response to the first data signal and the second data signal, the driving circuit is used to decouple the data line from the power supply node and the reference node. Decoupling the data line from the power supply node and the reference node includes the driving circuit having a high output impedance with reference to the data line.

The driving circuit decouples the data line from the power supply node and the reference node in response to the first and second data signals having the logical states corresponding to the write operation in which writing the data bit to the memory cell associated with the driving circuit is masked.

In some embodiments, decoupling the data line from the power supply node and the reference node includes using write line circuit 120B or 120T to decouple write line WLB or WLT from power supply node VDD and reference node VSS, discussed above with respect to memory circuit 100 and FIG. 1.

In some embodiments, using the driving circuit to decouple the data line from the power supply node includes decoupling the data line from the power supply node in response to the second data signal. In some embodiments, using the driving circuit to decouple the data line from the power supply node includes decoupling write driver 210 from power supply node VDD using interrupt circuit 220, discussed above with respect to driving circuit 200 and FIG. 2.

In some embodiments, using the driving circuit to decouple the data line from the reference node includes the driving circuit responding to the first data signal. In some embodiments, using the driving circuit to decouple the data line from the reference node includes turning off transistor N1 in response to the first data signal received at input node D1, discussed above with respect to driving circuits 200 and 300 and FIGS. 1 and 2.

In some embodiments, using the driving circuit to decouple the data line from the power supply node includes decoupling the data line from the power supply node in response to the first and second data signals. In some embodiments, using the driving circuit to decouple the data line from the power supply node includes decoupling output node OUT from write driver 210 using NOR gate NOR1 and transistor P3, discussed above with respect to driving circuit 300 and FIG. 3.

At operation 650, in some embodiments, operation 610 is repeated, and the data line is coupled with the power supply node using the pre-charging circuit.

At operation 660, in some embodiments, the driving circuit is used to output a write line signal having one of a power supply voltage level or a reference voltage level on the data line. Outputting the write line signal having the power supply voltage level includes outputting the power supply voltage level carried on the power supply node, and outputting the write line signal having the reference voltage level includes outputting the reference voltage level carried on the reference node.

Outputting the write line signal having one of the power supply voltage level or the reference voltage level on the data line is in response to the first and second data signals having logical states corresponding to a write operation in which writing a data bit to the memory cell associated with the driving circuit is not masked.

In various embodiments, in the non-masked write operation, the memory circuit generates the first and second data signals each having the logically low state, each having the logically high state, the first data signal having the logically low state and the second data signal having the logically high state, or the first data signal having the logically high state and the second data signal having the logically low state.

In various embodiments, outputting one of the power supply voltage level or the reference voltage level on the data line is performed after operation 650 and/or before operation 610.

By executing some or all of the operations of method 600, a data line is caused to float during a masked write operation, thereby obtaining the benefits discussed above with respect to memory circuit 100 and FIG. 1.

In some embodiments, a write line circuit includes a power supply node configured to carry a power supply voltage level, a reference node configured to carry a reference voltage level, a first input node configured to receive a first data signal, a second input node configured to receive a second data signal, a third input node configured to receive a control signal, and an output node. The write line circuit is configured to, responsive to the first data signal, the second data signal, and the control signal, either output one of the power supply voltage level or the reference voltage level on the output node, or float the output node. In some embodiments, when the first data signal and the second data signal have a same logical state, the write line circuit is configured to float the output node, and when the first data signal and the second data signal have different logical states, the write line circuit is configured to output one of the power supply voltage level or the reference voltage level on the output node. In some embodiments, the same logical state is a low logical state. In some embodiments, the write line circuit further includes an inverter responsive to the first data signal and a switching device coupled with the inverter, and the write line circuit is configured to float the output node by opening the switching device responsive to the second data signal. In some embodiments, the switching device is coupled between the inverter and the power supply node. In some embodiments, the switching device is coupled between the inverter and the output node. In some embodiments, the write line circuit further includes a first switching device coupled between the power supply node and the output node, the first switching device being configured to couple the output node with the power supply node responsive to the control signal. In some embodiments, the control signal is a first control signal of a plurality of control signals, and the write line circuit further includes a fourth input node configured to receive a second control signal of the plurality of control signals and a second switching device in series with the first switching device, the second switching device configured to couple the output node with the power supply node responsive to the second control signal of the plurality of control signals. In some embodiments, the write line circuit is part of a memory macro comprising a memory segment configured to receive a pre-charge signal, and the control signal is based on the pre-charge signal.

In some embodiments, a circuit includes a write driver coupled with a segment of an array of memory cells, the write driver configured to receive a first data signal at a first input node and generate a write line signal on a data line responsive to the first data signal, and an interrupt circuit coupled between the write driver and a power supply node configured to carry a power supply voltage level, wherein the interrupt circuit is configured to receive a second data signal at a second input node and decouple the write driver from the power supply node responsive to the second data signal. In some embodiments, the write driver is configured to float the data line when the write driver is decoupled from the power supply node and the first data signal has a first logical state. In some embodiments, the write driver is configured to generate the write line signal having a low logical state when the write driver is decoupled from the power supply node and the first data signal has a high logical state. In some embodiments, the circuit further includes a pre-charge circuit coupled between the data line and the power supply node, the pre-charge circuit configured to charge the data line to the power supply voltage level responsive to a control signal. In some embodiments, the pre-charge circuit includes a first PMOS transistor in series with a second PMOS transistor, a gate of the first PMOS transistor is configured to receive the control signal corresponding to the segment of the array of memory cells, and a gate of the second PMOS transistor is configured to receive another control signal corresponding to another segment of the array of memory cells. In some embodiments, the write driver includes an inverter. In some embodiments, the interrupt circuit includes a PMOS transistor.

In some embodiments, a method of floating a data line includes receiving a first data signal at a first input node of a driving circuit coupled with the data line, a power supply node, and a reference node, receiving a second data signal at a second input node of the driving circuit, and, in response to the first data signal and the second data signal, using the driving circuit to decouple the data line from the power supply node and the reference node. In some embodiments, receiving the first data signal at the first input node includes receiving the first data signal with a write driver, receiving the second data signal at the second input node includes receiving the second data signal with an interrupt circuit coupled between the write driver and the power supply node, and using the driving circuit to decouple the data line from the power supply node includes decoupling the write driver from the power supply node. In some embodiments, decoupling the data line from the reference node is in response to the first data signal having a first logical state, and decoupling the write driver from the power supply node is in response to the second data signal having the first logical state. In some embodiments, the method further includes using a pre-charging circuit to couple the data line with the power supply node prior to the using the driver circuit to decouple the data line from the power supply node and the reference node, and decouple the data line from the power supply node concurrently with using the driver circuit to decouple the data line from the power supply node and the reference node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A write line circuit comprising:
a power supply node configured to carry a power supply voltage level;
a reference node configured to carry a reference voltage level;
a first input node configured to receive a first data signal;
a second input node configured to receive a second data signal;
a third input node configured to receive a control signal;
an output node;
first and second switching devices coupled in series between the output node and the power supply node; and
a third switching device coupled between the output node and the reference node,
wherein the write line circuit is configured to:
responsive to the first data signal, the second data signal, and the control signal, either couple the output node with one of the power supply node through the first and second switching devices or the reference node, or float the output node,
responsive to the first data signal, decouple the output node from the reference node by switching off the third switching device independent of the second data signal and the control signal, and
responsive to the control signal, couple the output node with the power supply node independent of the first and second switching devices.

2. The write line circuit of claim 1, wherein
when the first data signal and the second data signal have a same logical state, the write line circuit is configured to float the output node, and
when the first data signal and the second data signal have different logical states, the write line circuit is configured to output one of the power supply voltage level or the reference voltage level on the output node.

3. The write line circuit of claim 2, wherein the same logical state is a low logical state.

4. The write line circuit of claim 1, wherein
the first switching device is included in an inverter responsive to the first data signal and coupled with the second switching device, and
the write line circuit is configured to float the output node by opening the second switching device responsive to the second data signal.

5. The write line circuit of claim 4, wherein the second switching device is coupled between the inverter and the power supply node.

6. The write line circuit of claim 4, wherein the second switching device is coupled between the inverter and the output node.

7. The write line circuit of claim 1, wherein the write line circuit further comprises a fourth switching device coupled between the power supply node and the output node, the fourth switching device being configured to couple the output node with the power supply node responsive to the control signal.

8. The write line circuit of claim 7, wherein
the control signal is a first control signal of a plurality of control signals, and
the write line circuit further comprises:
a fourth input node configured to receive a second control signal of the plurality of control signals; and
a fifth switching device in series with the fourth switching device, the fifth switching device configured to couple the output node with the power supply node responsive to the second control signal of the plurality of control signals.

9. The write line circuit of claim 1, wherein
the write line circuit is part of a memory macro comprising a memory segment configured to receive a pre-charge signal, and
the control signal is based on the pre-charge signal.

10. A circuit comprising:
a write driver coupled with a segment of an array of memory cells, the write driver configured to
receive a first data signal at a first input node and at a gate of a first transistor coupled to a data line, and generate a write line signal on the data line responsive to the first data signal;
an interrupt circuit comprising a second transistor coupled in series with the first transistor between the write driver and a power supply node configured to carry a power supply voltage level, wherein the interrupt circuit is configured to receive a second data signal at a second input node and decouple the write driver from the power supply node responsive to the second data signal; and
a pre-charge circuit coupled between the data line and the power supply node, the pre-charge circuit configured to charge the data line to the power supply voltage level responsive to a control signal,
wherein the circuit is configured to, responsive to the first data signal and independent of the second data signal and the control signal, decouple the output node from a reference node configured to carry a reference voltage level.

11. The circuit of claim 10, wherein the write driver is configured to float the data line when the write driver is decoupled from the power supply node and the first data signal has a first logical state.

12. The circuit of claim 10, wherein the write driver is configured to generate the write line signal having a low logical state when the write driver is decoupled from the power supply node and the first data signal has a high logical state.

13. The circuit of claim 10, wherein
the pre-charge circuit comprises a first PMOS transistor in series with a second PMOS transistor,
a gate of the first PMOS transistor is configured to receive the control signal corresponding to the segment of the array of memory cells, and
a gate of the second PMOS transistor is configured to receive another control signal corresponding to another segment of the array of memory cells.

14. The circuit of claim 10, wherein the write driver comprises an inverter comprising the first transistor.

15. The circuit of claim 10, wherein each of the first and second transistors is a PMOS transistor.

16. The circuit of claim 10, wherein
the segment of the array of memory cells comprises a bit line coupled to a bit line pre-charger, and
the bit line pre-charger is configured to charge the bit line to the power supply voltage level responsive to the control signal.

17. A method of floating a data line, the method comprising:
receiving a first data signal at a first input node of a driving circuit coupled with the data line, a power supply node, and a reference node;
receiving a second data signal at a second input node of the driving circuit;

in response to the first data signal and the second data signal, using series coupled first and second transistors of the driving circuit to decouple the data line from the power supply node and a third transistor of the driving circuit to decouple the data line from the reference node; and using a pre-charging circuit to:
  couple the data line with the power supply node prior to the using the driving circuit to decouple the data line from the power supply node and the reference node; and
  decouple the data line from the power supply node concurrently with the using the driving circuit to decouple the data line from the power supply node and the reference node,
wherein the decoupling the data line from the reference node using the third transistor of the driving circuit is in response to the first data signal and independent of the second data signal and the control signal.

18. The method of claim 17, wherein
the receiving the first data signal at the first input node comprises receiving the first data signal with a write driver comprising the first transistor,
the receiving the second data signal at the second input node comprises receiving the second data signal with an interrupt circuit coupled between the write driver and the power supply node, the interrupt circuit comprising the second transistor, and
the using the driving circuit to decouple the data line from the power supply node comprises decoupling the write driver from the power supply node.

19. The method of claim 18, wherein
the decoupling the data line from the reference node is in response to the first data signal having a first logical state, and
the decoupling the write driver from the power supply node is in response to the second data signal having the first logical state.

20. The method of claim 17, wherein
the data line is coupled to a bit line through a selection circuit, and
the method further comprises using a bit line pre-charger to:
  couple the bit line with the power supply node concurrently with the using the pre-charging circuit to couple the data line with the power supply node; and
  decouple the bit line from the power supply node concurrently with the using the pre-charging circuit to decouple the data line from the power supply node.

* * * * *